US009408311B2

(12) United States Patent
Kanryo et al.

(10) Patent No.: US 9,408,311 B2
(45) Date of Patent: Aug. 2, 2016

(54) METHOD OF MANUFACTURING ELECTRONIC COMPONENT MODULE AND ELECTRONIC COMPONENT MODULE

(71) Applicant: MURATA MANUFACTURING CO., LTD., Kyoto (JP)

(72) Inventors: Koichi Kanryo, Kyoto (JP); Akio Katsube, Kyoto (JP); Shunsuke Kitamura, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 223 days.

(21) Appl. No.: 13/936,007

(22) Filed: Jul. 5, 2013

(65) Prior Publication Data
US 2013/0294034 A1 Nov. 7, 2013

Related U.S. Application Data

(63) Continuation of application No. PCT/JP2012/050094, filed on Jan. 5, 2012.

(30) Foreign Application Priority Data

Jan. 7, 2011 (JP) .................................. 2011-002023

(51) Int. Cl.
*H05K 3/30* (2006.01)
*H01L 21/56* (2006.01)
(Continued)

(52) U.S. Cl.
CPC ............... *H05K 3/301* (2013.01); *H01L 21/561* (2013.01); *H01L 21/568* (2013.01);
(Continued)

(58) Field of Classification Search
CPC .................... Y10T 29/49146; Y10T 29/4913; Y10T 29/49124; Y10T 29/49117; Y10T 29/49002; Y10T 29/49151; H01L 21/561; H01L 21/568; H01L 21/6835; H01L 23/3121; H01L 23/552; H01L 23/295; H01L 24/16; H01L 24/97; H01L 2224/16225; H01L 2224/48227; H01L 2224/97; H01L 2224/81; H01L 2224/85; H01L 2224/131; H01L 2924/15313; H01L 2924/19105; H01L 2924/3025; H01L 2924/19043; H01L 2924/19041; H01L 2924/01029
USPC ........ 29/841, 832, 829, 592.1, 412, 417, 844
See application file for complete search history.

(56) References Cited

U.S. PATENT DOCUMENTS

2002/0197770 A1* 12/2002 Irie ...................... H01L 21/561
438/114
2004/0099112 A1* 5/2004 Ohmiya .............. H01L 21/6838
83/100
(Continued)

FOREIGN PATENT DOCUMENTS

CN 100416785 C 9/2008
JP 04-188848 A 7/1992
(Continued)

OTHER PUBLICATIONS

An Office Action; "Notice of Reasons for Rejection," issued by the Japanese Patent Office on Aug. 5, 2014, which corresponds to Japanese Patent Application No. 2012-551871 and is related to U.S. Appl. No. 13/936,007; with English language translation.
(Continued)

*Primary Examiner* — Peter DungBa Vo
*Assistant Examiner* — Azm Parvez
(74) *Attorney, Agent, or Firm* — Studebaker & Brackett PC

(57) ABSTRACT

A method of manufacturing an electronic component module includes sealing a surface of an aggregate substrate on which a plurality of electronic components are mounted with a sealing resin and cutting boundary portions between electronic component modules from an outer surface of the sealing resin to a position at least partially through the aggregate substrate to form first grooves. A shield layer is formed by coating the outer surface of the sealing resin with a conductive resin and filling the first grooves with the conductive resin, and recesses are formed at positions on the shield layer where the first grooves are formed. The boundary portions between electronic component modules are cut along the corresponding recesses so that second grooves each having a width smaller than the width of a corresponding one of the recesses are formed, and the aggregate substrate is singulated into the individual electronic component modules.

9 Claims, 10 Drawing Sheets

(51) Int. Cl.
| | |
|---|---|
| *H01L 23/31* | (2006.01) |
| *H01L 23/552* | (2006.01) |
| *H05K 3/28* | (2006.01) |
| *H05K 9/00* | (2006.01) |
| *H05K 1/18* | (2006.01) |
| *H01L 21/683* | (2006.01) |
| *H01L 23/00* | (2006.01) |
| *H05K 3/00* | (2006.01) |
| *H01L 23/29* | (2006.01) |

(52) U.S. Cl.
CPC ......... *H01L 23/3121* (2013.01); *H01L 23/552* (2013.01); *H05K 1/185* (2013.01); *H05K 3/284* (2013.01); *H05K 9/0045* (2013.01); *H01L 21/6835* (2013.01); *H01L 23/295* (2013.01); *H01L 24/16* (2013.01); *H01L 24/97* (2013.01); *H01L 2224/131* (2013.01); *H01L 2224/16225* (2013.01); *H01L 2224/16227* (2013.01); *H01L 2224/48227* (2013.01); *H01L 2224/81005* (2013.01); *H01L 2224/97* (2013.01); *H01L 2924/01029* (2013.01); *H01L 2924/15159* (2013.01); *H01L 2924/15313* (2013.01); *H01L 2924/1815* (2013.01); *H01L 2924/19041* (2013.01); *H01L 2924/19043* (2013.01); *H01L 2924/19105* (2013.01); *H01L 2924/3025* (2013.01); *H05K 3/0052* (2013.01); *H05K 2201/0715* (2013.01); *H05K 2201/0909* (2013.01); *H05K 2203/302* (2013.01); *Y10T 29/49146* (2015.01)

(56) References Cited

U.S. PATENT DOCUMENTS

| | | |
|---|---|---|
| 2006/0079019 A1 | 4/2006 | Kim |
| 2011/0180933 A1 | 7/2011 | Inoue et al. |

FOREIGN PATENT DOCUMENTS

| | | | |
|---|---|---|---|
| JP | 2001-156208 A | 6/2001 | |
| JP | 2003007652 A | 1/2003 | |
| JP | 2004-047693 A | 2/2004 | |
| JP | 2004-172176 A | 6/2004 | |
| JP | 2007-335424 A | 12/2007 | |
| JP | WO 2009144960 A1 * | 12/2009 | ............ H01L 21/561 |
| WO | 2009/144960 A1 | 12/2009 | |

OTHER PUBLICATIONS

International Search Report; PCT/JP2012/050094; Apr. 10, 2012.
Written Opinion of the International Searching Authority; PCT/JP2012/050094; Apr. 10, 2012.
An Office Action; "Notice on the First Office Action," issued by the State Intellectual Property Office of the People's Republic of China on Jul. 3, 2015, which corresponds to Chinese Patent Application No. 201280004793.3 and is related to U.S. Appl. No. 13/936,007; with English language translation.

* cited by examiner

METHOD OF MANUFACTURING ELECTRONIC COMPONENT MODULE AND ELECTRONIC COMPONENT MODULE

CROSS REFERENCE TO RELATED APPLICATIONS

The present application is a continuation of International Application No. PCT/JP2012/050094 filed on Jan. 5, 2012, and claims priority to Japanese Patent Application No. 2011-002023 filed on Jan. 7, 2011, the entire contents of each of these applications being incorporated herein by reference in their entirety.

TECHNICAL FIELD

The technical field relates to a method of manufacturing an electronic component module on which a plurality of electronic components are mounted, the electronic component module having side surfaces parts of which are coated with a conductive resin and a top surface that is coated with the conductive resin, and relates to an electronic component module that is manufactured by the manufacturing method.

BACKGROUND

In a method of manufacturing a circuit module (an electronic component module) disclosed in Japanese Unexamined Patent Application Publication No. 2004-172176 (Patent Document 1), after a sealing resin has been formed, and before a shield layer that coats the sealing resin is formed, grooves are formed by half-cutting an aggregate substrate (cutting halfway through the aggregate substrate) using a dicer or the like along separation lines along which the aggregate substrate is to be singulated into circuit modules. A top surface of the sealing resin is coated with a conductive resin, and the grooves that have been formed are filled with the conductive resin. The grooves that have been filled with the conductive resin are fully cut (the aggregate substrate is fully cut) using a dicer or the like, so that the aggregate substrate is singulated into circuit modules each having a top surface and side surfaces on which the shield layer is formed.

SUMMARY

The present disclosure provides a method of manufacturing an electronic component module capable of realizing a reduction in the height of an electronic component module even if a conductive-resin burr, a conductive-resin projection, or the like is formed on a shield layer and to provide an electronic component module.

In one aspect of the present disclosure, a method of manufacturing an electronic component module includes a first step of sealing a surface of an aggregate substrate on which a plurality of electronic components are mounted with a sealing resin, a second step of cutting a boundary portion between electronic component modules from an outer surface of the sealing resin to a position where the aggregate substrate is cut at least partially through and forming a first groove, a third step of forming a shield layer by coating the outer surface of the sealing resin with a conductive resin and by filling the first groove with the conductive resin, a fourth step of forming a recess at a position on the shield layer where the first groove is formed, and a fifth step of cutting the boundary portion between the electronic component modules along the recess from an outer surface side of the shield layer to the position where the aggregate substrate is cut at least partially through, forming a second groove having a width smaller than the width of the recess, and singulating the aggregate substrate into the individual electronic component modules.

In a more specific embodiment of the method of manufacturing an electronic component module according to the present disclosure, in the fourth step the aggregate substrate on which the sealing resin is formed may be made to curve in such a manner that the outer surface of the sealing resin becomes a convex surface while the conductive resin with which the first groove is filled is in an uncured state, so that the recess is formed at the position on the shield layer where the first groove is formed.

In another more specific embodiment of the method of manufacturing an electronic component module according to the present disclosure, in the fourth step the width of the first groove may be increased while the conductive resin with which the first groove is filled is in an uncured state, so that the recess is formed at the position on the shield layer where the first groove is formed.

In yet another more specific embodiment of the method of manufacturing an electronic component module according to the present disclosure, in the fourth step the conductive resin with which the first groove is filled may be cured, part of the conductive resin that has been cured may be scraped off, and the recess may be formed at the position on the shield layer where the first groove is formed.

In another aspect of the present disclosure, a method of manufacturing an electronic component module includes a first step of sealing a surface of an aggregate substrate on which a plurality of electronic components are mounted with a sealing resin, a second step of cutting a boundary portion between electronic component modules from an outer surface of the sealing resin to a position where the aggregate substrate is cut at least partially through and forming a first groove, a third step of forming a shield layer by coating the outer surface of the sealing resin with a conductive resin and by filling the first groove with the conductive resin, and a fourth step of cutting the boundary portion between the electronic component modules from an outer surface side of the shield layer and singulating the aggregate substrate into the individual electronic component modules. In the third step, the quantity of the conductive resin with which the first groove is filled is adjusted in such a manner that a portion of the shield layer at a position where the first groove is formed dips, so that a recess is formed at the position on the shield layer where the first groove is formed. In the fourth step, the boundary portion between the electronic component modules is cut along the recess from the outer surface side of the shield layer to the position where the aggregate substrate is cut at least partially through, a second groove having a width smaller than the width of the recess is formed, and the aggregate substrate is singulated into the individual electronic component modules.

In another more specific embodiment of any of the above methods of manufacturing an electronic component module according to the present disclosure, in the second step, the boundary portion may be cut between electronic component modules from an outer surface of the sealing resin to a position where the aggregate substrate is completely cut through.

In another more specific embodiment of any of the above methods of manufacturing an electronic component module according to the present disclosure, in the second step, the boundary portion may be cut between electronic component modules from an outer surface of the sealing resin to a position where the aggregate substrate is cut halfway through.

In another aspect of the present disclosure, an electronic component module is manufactured by the method of manufacturing an electronic component module having any one of the above-described configurations.

In another aspect of the present disclosure, an electronic component module includes a base substrate, a plurality of electronic components that are mounted on at least one surface of the base substrate, a sealing resin that seals the plurality of electronic components mounted on the one surface of the base substrate, and a shield layer that coats an outermost surface of the sealing resin and coats at least parts of side surfaces of the sealing resin. The shield layer formed on each of the side surfaces of the sealing resin is formed in such a manner that the thickness of a portion of the shield layer adjacent to the outermost surface of the sealing resin is smaller than the thicknesses of other portions of the shield layer.

In a more specific embodiment of the electronic component module, the shield layer may coat entire side surfaces of the sealing resin.

In another more specific embodiment of the electronic component module, the outermost surface of the sealing resin may be substantially parallel with the at least one surface of the base substrate.

DETAILED DESCRIPTION

Figure 9:
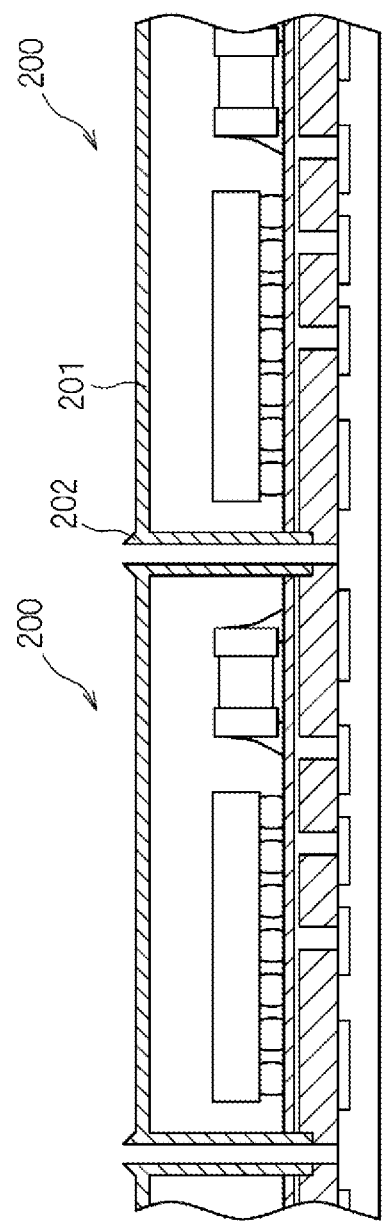
FIG. 9 is a schematic diagram illustrating a configuration of an electronic component module of the related art in the case where conductive-resin burrs are formed on a top surface of a shield layer.

The inventors realized that in the method of manufacturing a circuit module disclosed in Patent Document 1, when the conductive resin with which the grooves are filled is fully cut using the dicer or the like, the dicer or the like comes into contact with the shield layer on the top surface and fully cuts the conductive resin with which the grooves are filled from the top surface, and therefore, conductive-resin burrs caused by fully cutting the conductive resin using the dicer or the like are formed on the top surface of the shield layer. FIG. 9 is a schematic diagram illustrating a configuration of an electronic component module of the related art in the case where conductive-resin burrs are formed on a top surface of a shield layer. In electronic component modules 200 illustrated in FIG. 9, conductive-resin burrs 202 caused by fully cutting a conductive resin using the dicer or the like are formed on a top surface of a shield layer 201. Therefore, the heights of the electronic component modules 200 are increased by the heights of the conductive-resin burrs 202 that are formed on the electronic component modules 200, and there has been a problem in that the height of each of the electronic component modules 200 cannot be reduced.

As a method of forming a shield layer that coats a conductive resin, for example, a contact printing method, a vacuum printing method, or an off-contact printing method may sometimes be used. The inventors realized that in the case where a contact printing method is used, after a squeegee moves on a mesh mask in such a manner that a conductive resin is supplied to a top surface of a sealing resin and to grooves, the mesh mask pulls on the conductive resin that is contact with the mesh mask when electronic component modules are separated from the mesh mask, and conductive-resin projections may sometimes be formed on a shield layer.

Figure 10:
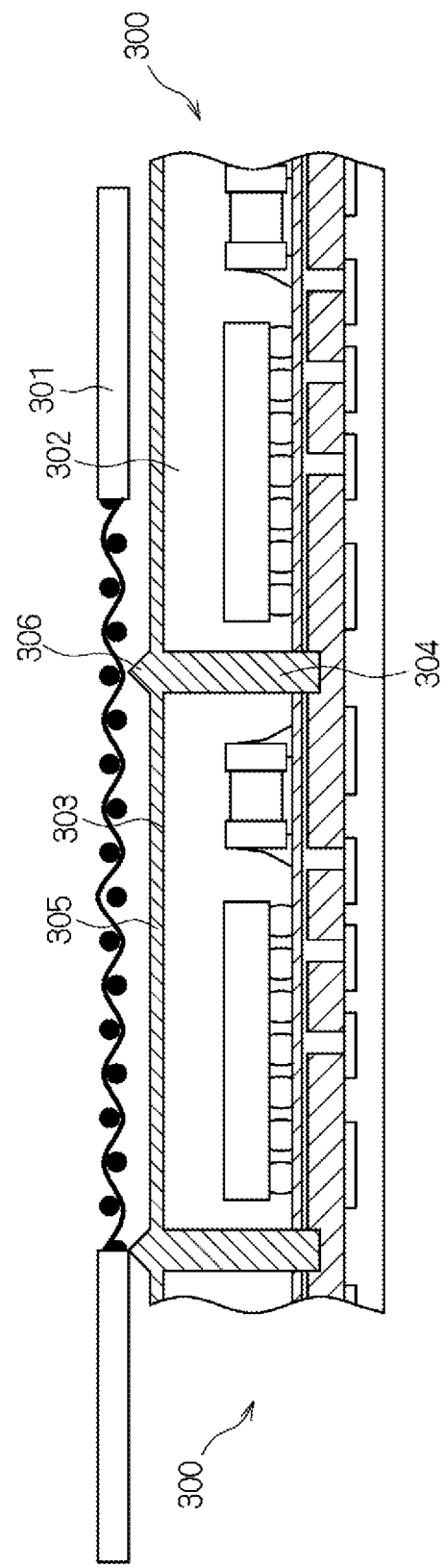
FIG. 10 is a schematic diagram illustrating a configuration of an electronic component module of the related art in the case where a shield layer that coats a sealing resin is formed by a vacuum printing method.

FIG. 10 is a schematic diagram illustrating a configuration of an electronic component module of the related art in the case where a shield layer that coats a sealing resin is formed by a vacuum printing method. Electronic component modules 300 illustrated in FIG. 10 are separated from a mesh mask 301 after a squeegee moves on the mesh mask 301 in such a manner that a conductive resin is supplied to a top surface 303 of a sealing resin 302 and to grooves 304. The inventors realized that because the grooves 304 are filled with the conductive resin, the amount of the conductive resin to be supplied to the grooves 304 is larger than that of the conductive resin to be supplied to the top surface 303 of the sealing resin 302, and therefore, when the electronic component modules 300 are separated from the mesh mask 301, the mesh mask 301 pulls on the conductive resin that has been supplied to the grooves 304, and conductive-resin projections 306 are formed at positions on a shield layer 305 where the grooves 304 are formed. Therefore, the heights of the electronic component modules 300 are increased by the heights of the conductive-resin projections 306 that are formed on the electronic component modules 300, and there has been a problem in that the height of each of the electronic component modules 300 cannot be reduced.

In the case where an off-contact printing method is used, electronic component modules are separated from a mesh mask along with a movement of a squeegee. However, the inventors realized that there has been a similar problem in that conductive-resin projections may be formed at positions on a shield layer where grooves are formed.

Embodiments of the present disclosure that can address the above shortcomings will now be described below in detail with reference to the drawings.

Figure 1:
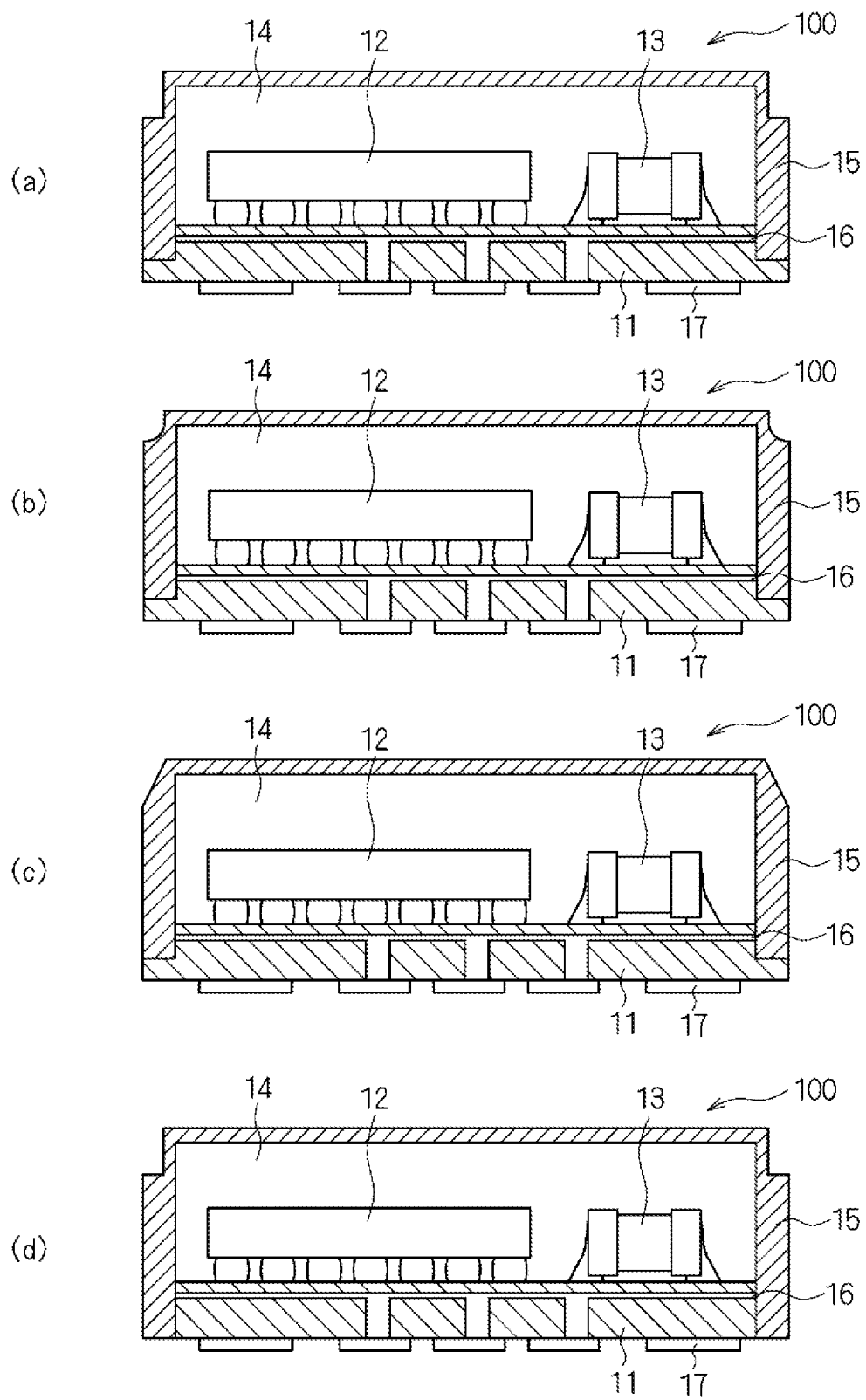
FIGS. 1(a) to 1(d) are schematic diagrams illustrating a configuration of an electronic component module according to a first exemplary embodiment.

FIGS. 1(a) to 1(d), sometimes collectively referred to as FIG. 1, are schematic diagrams illustrating a configuration of an electronic component module according to a first exemplary embodiment. An electronic component module 100 illustrated in FIG. 1(a) can have a rectangular parallelepiped shape whose dimensions are 10.0 mm×10.0 mm×1.2 mm as an example and includes a circuit board 11 made of a ceramic, a glass, an epoxy resin, or the like and electronic components 12 and 13, each of which is a semiconductor element, a capacitor, a resistance, a SAW filter, or the like, for example, and each of which is placed on a top surface of the circuit board (a base substrate) 11.

The circuit board 11 is, for example, a resin substrate that has a rectangular top surface and can have a thickness of about 0.5 mm. The circuit board 11 includes a signal pattern (not illustrated) on the surface thereof, the signal pattern serving as a bonding pad (an electrode pad) to which the electronic components 12 and 13 are to be bonded. A ground electrode 16 that is exposed from sides of the circuit board 11 is formed within the circuit board 11. The signal pattern of the circuit board 11 and terminals of the electronic components 12 and 13, each of which can be a semiconductor element, a capacitor, a resistance, or the like, for example, are bonded together with bonding wires, solder, or the like. External terminal electrodes 17 that are to be electrically connected to electrodes on a substrate of an electronic device or the like are provided on a bottom surface of the circuit board 11.

A sealing resin 14 that seals the top surface of the circuit board 11 is formed in such a manner as to coat the circuit board 11 and the electronic components 12 and 13. A shield layer 15 that shields the electronic components 12 and 13 from electric field noise and electromagnetic wave noise is formed on a top surface and side surfaces of the sealing resin 14. The shield layer 15 formed on each of the side surfaces of the sealing resin 14 is electrically connected to the ground electrode 16 provided within the circuit board 11. However, the shield layer 15 is not formed in such a manner as to reach the bottom surface of the circuit board 11. The shield layer 15 formed on each of the side surfaces of the sealing resin 14 is formed in such a manner that the thickness of a portion of the shield layer 15 adjacent to the top surface of the sealing resin 14 is smaller than the thicknesses of other portions of the shield layer 15. Note that the shield layer 15 that is formed on each of the side surfaces of the sealing resin 14 and illustrated in FIG. 1(a) has a shape in which the thickness of the portion of the shield layer 15 adjacent to the top surface of the sealing resin 14 changes in a stepwise manner.

The shape of the shield layer 15 formed on each of the side surfaces of the sealing resin 14 is not limited to the shape in which the thickness of the portion of the shield layer 15 adjacent to the top surface of the sealing resin 14 changes in a stepwise manner and may be a shape in which the thickness of the portion of the shield layer 15 adjacent to the top surface of the sealing resin 14 changes in an arc-like manner as illustrated in FIG. 1(b) or a shape in which the thickness of the portion of the shield layer 15 adjacent to the top surface of the sealing resin 14 changes in a linear manner as illustrated in FIG. 1(c). The shield layer 15 formed on each of the side surfaces of the sealing resin 14 is not limited to being formed in such a manner as not to reach the bottom surface of the circuit board 11 and may be formed in such a manner as to reach the bottom surface of the circuit board 11 as illustrated in FIG. 1(d).

Figure 2:
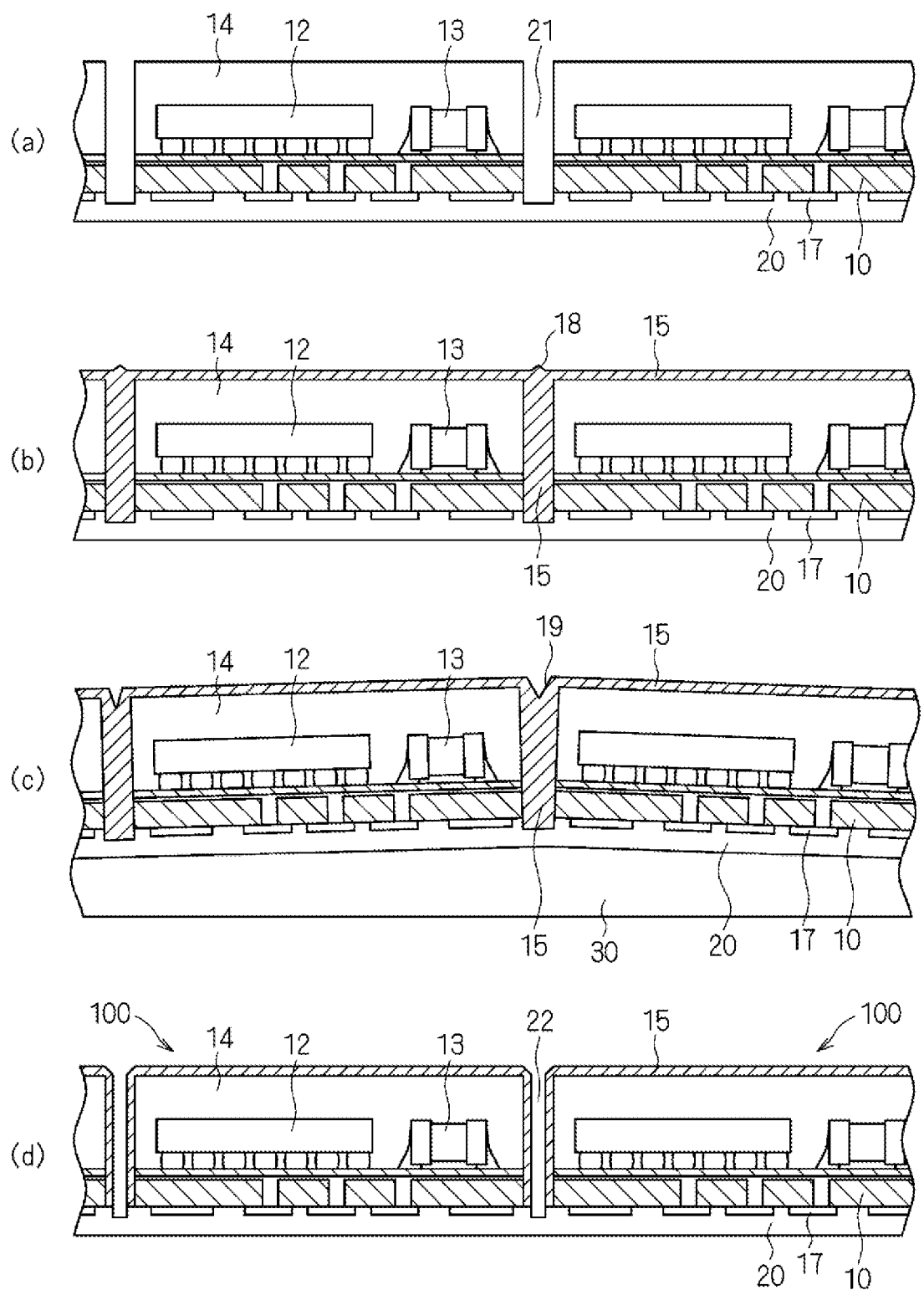
FIGS. 2(a) to 2(d) are schematic diagram for describing a method of manufacturing electronic component modules according to the first embodiment.

FIGS. 2(a) to 2(d), which are sometimes collectively referred to herein as FIG. 2, are schematic diagrams for describing a method of manufacturing electronic component modules 100 according to the first embodiment. First, as illustrated in FIG. 2(a), a surface of an aggregate substrate 10 on which a plurality of electronic components 12 and 13 are mounted is sealed with the sealing resin 14. An adhesive sheet 20 is attached to a bottom surface of the aggregate substrate 10 on which the external terminal electrodes 17 are provided. Boundary portions between the electronic component modules 100 are cut using a dicer or the like from the top surface of the sealing resin 14 to positions where the aggregate substrate 10 is completely cut, so that first grooves 21 are formed.

The aggregate substrate 10 is fully cut and divided into the individual electronic component modules 100. However, since the adhesive sheet 20 is attached to the bottom surface of the aggregate substrate 10, the individual electronic component modules 100 are in a state of being brought together even though the first grooves 21 that allow the aggregate substrate 10 to be completely cut are formed. In the case where the aggregate substrate 10 is completely cut, the bottom surface of each of the first grooves 21 is the adhesive sheet 20. Note that the embodiments consistent with the present disclosure are not limited to the case where the aggregate substrate 10 is completely cut, and the first grooves 21 may be formed by cutting halfway through the aggregate substrate 10 from the top surface of the sealing resin 14. In the case the aggregate substrate 10 is cut halfway through, the bottom surface of each of the first grooves 21 is the aggregate substrate 10.

Next, as illustrated in FIG. 2(b), the shield layer 15 is formed by coating the top surface of the sealing resin 14 with a conductive resin and filling the first grooves 21 with the conductive resin. As a method of forming the shield layer 15, for example, a printing method, a vacuum printing method, or the like is used. In the case where the conductive resin is supplied to the top surface of the sealing resin 14 and to the first grooves 21 using a mesh mask (not illustrated) by a printing method, a vacuum printing method, or the like, the mesh mask pulls on the conductive resin that has been supplied when the aggregate substrate 10 is separated from the mesh mask, and conductive-resin projections 18 are formed on the shield layer 15. Note that an electrically conductive component (a filler) that is included in the conductive resin is, for example, Ag, Cu, Ni, or the like, and a resin (a binder) that includes such an electrically conductive component is, for example, an epoxy resin, a phenolic resin, a urethane resin, a silicon resin, a polyester resin, an acrylic resin, a polyimide resin, or the like.

Next, as illustrated in FIG. 2(c), recesses 19 are formed at positions on the shield layer 15 where the first grooves 21 are formed. As a method of forming the recesses 19, while the conductive resin with which the first grooves 21 are filled is in an uncured state, the aggregate substrate 10 on which the sealing resin 14 has been formed is made to curve using a jig 30 in such a manner that the top surface of the sealing resin 14 becomes a convex surface, and the width of a portion of each of the first grooves 21 adjacent to the top surface of the sealing resin 14 is increased, so that the shield layer 15 dips, and the recesses 19 are formed at the positions on the shield layer 15 where the first grooves 21 are formed. Since the recesses 19 are formed at positions where the conductive-resin projections 18 are formed, even if the conductive-resin projections 18 are formed, the conductive-resin projections 18 do not affect the heights of the electronic component modules 100, and a reduction in the height of each of the electronic component modules 100 can be realized.

Figure 3:
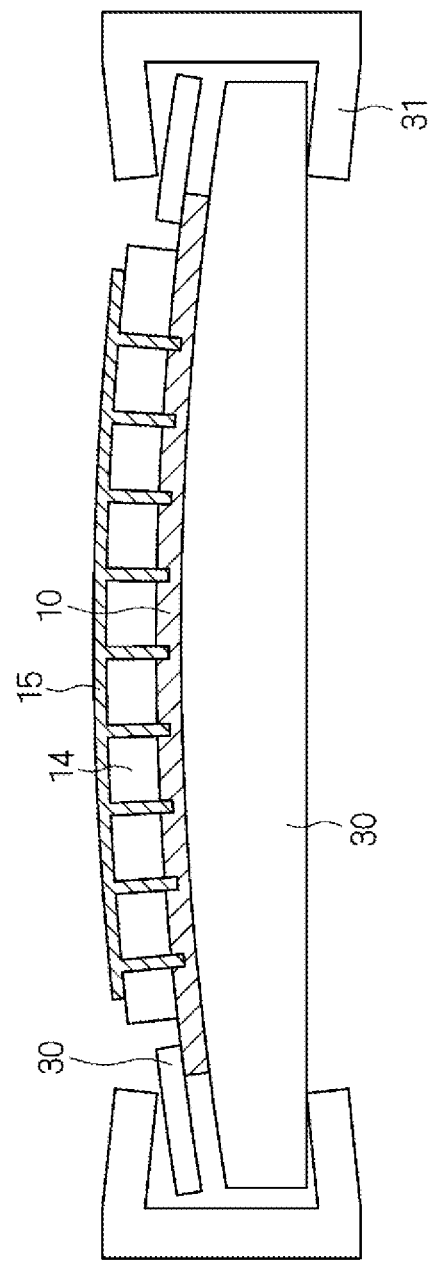
FIG. 3 is a schematic diagram illustrating a configuration of a jig that is used in the method of manufacturing electronic component modules according to the first embodiment.

FIG. 3 is a schematic diagram illustrating a configuration of the jig 30 that can be used in the method of manufacturing the electronic component modules 100 according to the first exemplary embodiment. The jig 30 illustrated in FIG. 3 is made of a metal, a heat-resistant resin, or the like, and a surface of the jig 30 protrudes in a convex manner. The aggregate substrate 10 is placed on the surface of the jig 30, which protrudes in a convex manner, and ends of the aggregate substrate 10, which has been placed on the surface of the jig 30, are fixed in place with clamps 31 while the conductive resin with which the first grooves 21 are filled is in an uncured state, so that the aggregate substrate 10 on which the sealing resin 14 is formed is made to curve in such a manner that the top surface of the sealing resin 14 becomes a convex surface, and the recesses 19 are formed at the positions on the shield layer 15 where the first grooves 21 are formed. In addition, the aggregate substrate 10 is placed in, for example, a heating furnace, a vacuum furnace, or the like while the aggregate substrate 10 is maintained in a curved state, and the conductive resin is cured, so that the shape of each of the recesses 19 that have been formed in the shield layer 15 can be maintained even if the aggregate substrate 10 is released from the jig 30. Note that when the sealing resin 14 is applied on the aggregate substrate 10 and is cured, the aggregate substrate 10 often warps in a recessed manner due to a difference between the thermal expansion coefficients of the aggregate substrate 10 and the sealing resin 14, cure shrinkage of the sealing resin 14, and the like. However, the warping of the aggregate substrate 10 in a recessed manner can be suppressed by making the aggregate substrate 10 on which the sealing resin 14 is formed curve using the jig 30 in such a manner that the top surface of the sealing resin 14 becomes a convex surface. As a result, the aggregate substrate 10 can have an improved property of being adsorbed on a stage in a dicing process, which is a subsequent process, and the precision with which the aggregate substrate 10 is cut in such a manner as to be singulated into the individual electronic component modules 100 can be improved. Since the surface of the jig 30, which protrudes in a convex manner, has a predetermined curvature, the width of the portion of each of the first grooves 21 adjacent to the top surface of the sealing resin 14 can be uniformly increased, and the recesses 19 that have small variations in size can be formed at the positions on the shield layer 15 where the first grooves 21 are formed.

Figure 4:
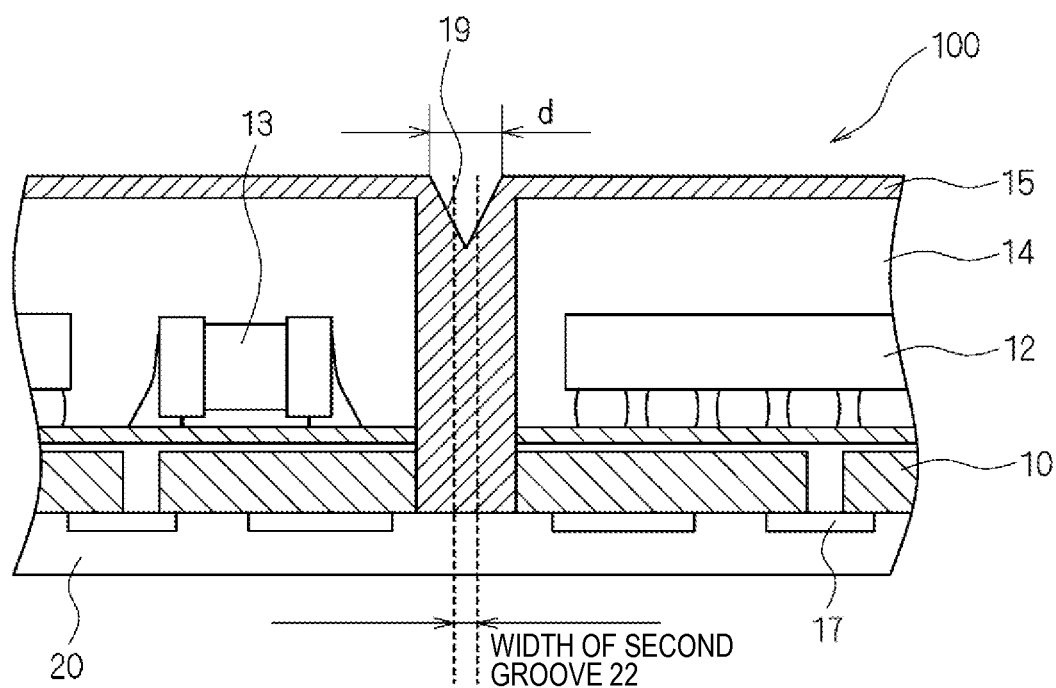
FIG. 4 is a schematic diagram illustrating the width of a second groove that is to be formed in the electronic component module according to the first embodiment.

Returning to FIG. 2, as illustrated in FIG. 2(d), the boundary portions between the electronic component modules 100 are cut along the corresponding recesses 19 from a side of the top surface of the sealing resin 14 to the positions where the aggregate substrate 10 is completely cut, so that second grooves 22 each having a width smaller than the width of a corresponding one of the recesses 19 are formed, and the aggregate substrate 10 is singulated into the individual electronic component modules 100. FIG. 4 is a schematic diagram illustrating the width of one of the second grooves 22 that is to be formed in one of the electronic component modules 100 according to the first exemplary embodiment. The width of the second groove 22 that is to be formed in one of the boundary portions between the electronic component modules 100 illustrated in FIG. 4 is smaller than the width d of the recess 19. When the boundary portion between the electronic component modules 100 is cut along the recess 19 using a dicer or the like from the side of the top surface of the sealing resin 14 in order to form the second groove 22, the dicer or the like and the shield layer 15 are brought into contact with each other not on the surface of the shield layer 15 but on an inner surface of the recess 19. Thus, conductive-resin burrs caused by cutting the conductive resin using the dicer or the like are formed in the recess 19. Therefore, even if conductive-resin burrs are formed, the conductive-resin burrs do not project from the surface of the shield layer 15. Alternatively, even if the conductive-resin burrs project from the surface of the shield layer 15, the height of each of the conductive-resin burrs that project from the surface of the shield layer 15 is small, and thus, the influence of each of the conductive-resin burrs on the height of the corresponding electronic component module 100 is small. Therefore, a reduction in the height of each of the electronic component modules 100 can be realized.

Figure 5:
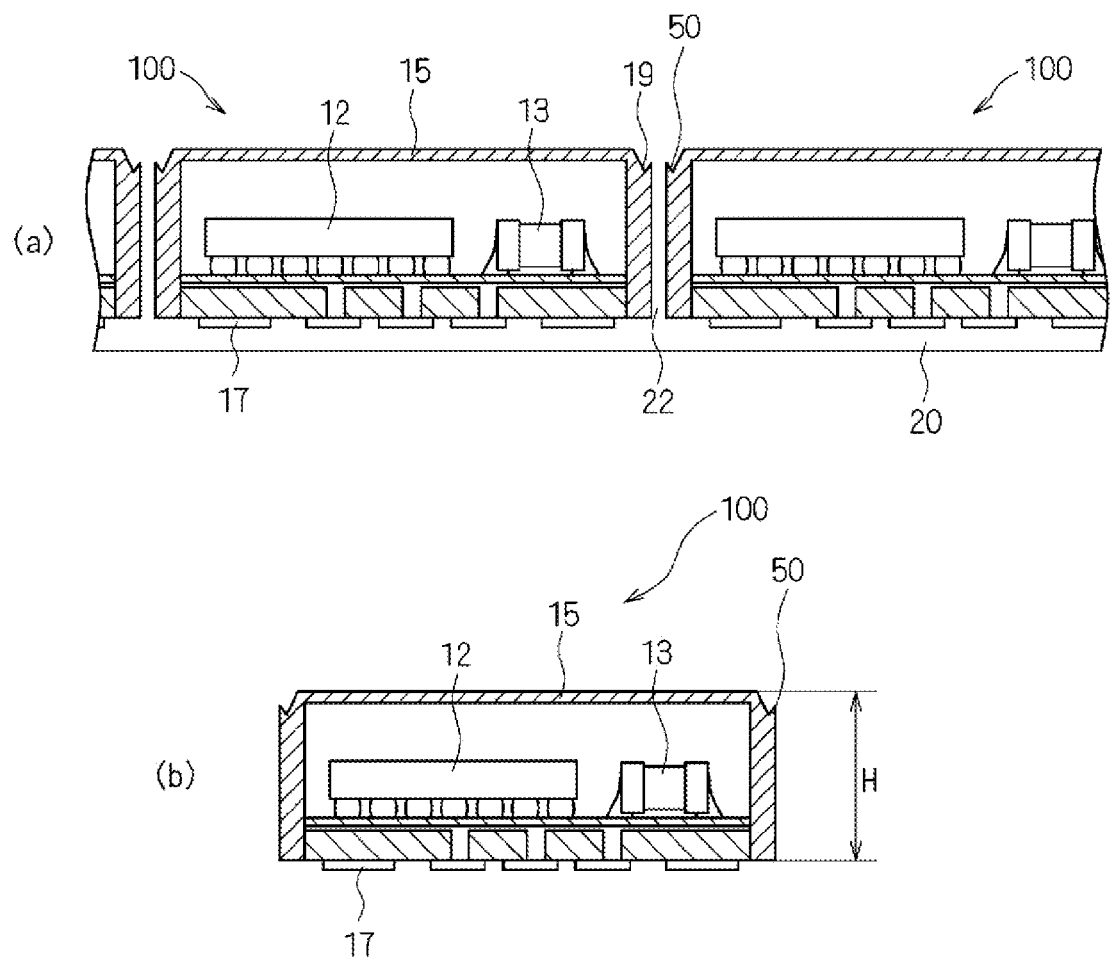
FIGS. 5(a) and 5(b) are schematic diagrams illustrating conductive-resin burrs that are formed on the electronic component module according to the first embodiment.

FIG. 5 is a schematic diagram illustrating conductive-resin burrs that are formed on the electronic component module 100 according to the first exemplary embodiment. As illustrated in FIG. 5(a), conductive-resin burrs 50 caused by cutting the conductive resin using a dicer or the like are formed in the corresponding recesses 19. Therefore, as illustrated in FIG. 5(b), even if the conductive-resin burrs 50 are formed, the influence of each of the conductive-resin burrs 50 on the height H of the corresponding electronic component module 100 is small, and a reduction in the height of the electronic component module 100 can be realized.

Note that since the adhesive sheet 20 is attached to the bottom surface of the aggregate substrate 10 illustrated in FIG. 2(d), the individual electronic component modules 100 are in a state of being brought together even if the second grooves 22 are formed by completely cutting the aggregate substrate 10. Thus, in order to singulate the aggregate substrate 10 into the individual electronic component modules 100, the individual electronic component modules 100 need to be separated from the adhesive sheet 20. Embodiments consistent with the present disclosure are not limited to the case where the aggregate substrate 10 is completely cut, and the second grooves 22 may be formed by cutting halfway through the aggregate substrate 10. In the case the aggregate substrate 10 is cut halfway through, in order to singulate the aggregate substrate 10 into the individual electronic component modules 100, scores need to be formed in a perforated manner in the bottom surface of the aggregate substrate 10 that remains uncut, and the aggregate substrate 10 needs to be divided at the scores which are formed in the aggregate substrate 10.

As described above, in the method of manufacturing the electronic component modules 100 according to the first embodiment, the recesses 19 are formed at the positions on the shield layer 15 where the first grooves 21 are formed, the boundary portions between the electronic component modules 100 are cut along the corresponding recesses 19 from the side of the top surface of the sealing resin 14 to the positions where the aggregate substrate 10 is completely cut or to positions where the aggregate substrate 10 is cut halfway through, the second grooves 22 each having the width smaller than the width of the corresponding recess 19 are formed, and the aggregate substrate 10 is singulated into the individual electronic component modules 100. Therefore, the conductive-resin burrs 50 caused by cutting the conductive resin using a dicer or the like are formed in the corresponding recesses 19. Even if the conductive-resin burrs 50 are formed, the influence of each of the conductive-resin burrs 50 on the height of the corresponding electronic component module 100 is small, and a reduction in the height of each of the electronic component modules 100 can be realized. In the case where the shield layer 15 is formed by coating the top surface of the sealing resin 14 with the conductive resin and filling the first grooves 21 with the conductive resin by a printing method, a vacuum printing method, or the like, even if the mesh mask pulls on the conductive resin when the aggregate substrate 10 is separated from the mesh mask, and the conductive-resin projections 18 are formed at the positions on the shield layer 15 where the first grooves 21 are formed, the recesses 19 are formed at the positions in the subsequent process. Thus, even if the conductive-resin projections 18 are formed, the conductive-resin projections 18 do not affect the heights of the electronic component modules 100, and a reduction in the height of each of the electronic component modules 100 can be realized.

Since each of the electronic component modules 100 is manufactured by the method of manufacturing electronic component modules according to the first exemplary embodiment, a reduction in the height of each of the electronic component modules 100 can be realized even if the conductive-resin burrs 50, the conductive-resin projections 18, or the like are formed on the shield layer 15. In addition, in the method of manufacturing the electronic component modules 100 according to the first embodiment, the recesses 19 are formed at the positions on the shield layer 15 where the first grooves 21 are formed, and thus, in the shield layer 15 formed on each of the side surfaces of the sealing resin 14, the thickness of the portion of the shield layer 15 adjacent to the top surface of the sealing resin 14 is smaller than the thicknesses of other portions of the shield layer 15.

In the method of manufacturing the electronic component modules 100 according to the first embodiment, while the conductive resin with which the first grooves 21 are filled is in an uncured state, the aggregate substrate 10 on which the sealing resin 14 is formed is made to curve in such a manner that the top surface of the sealing resin 14 becomes a convex surface, and the width of the portion of each of the first grooves 21 adjacent to the top surface of the sealing resin 14 is increased, so that the shield layer 15 dips, and the recesses 19 are formed at the positions on the shield layer 15 where the first grooves 21 are formed. However, in a method of manufacturing electronic component modules according to a second exemplary embodiment, the widths of first grooves are increased using an expanding apparatus while a conductive resin with which the first grooves are filled is in an uncured state, so that recesses are formed at positions on a shield layer 15 where the first grooves are formed. Note that an electronic component module according to the second embodiment has a configuration the same as that of the electronic component module 100 illustrated in FIG. 1, and thus, similar or the same reference numerals are used, and detailed descriptions thereof will not be repeated.

Figure 6:
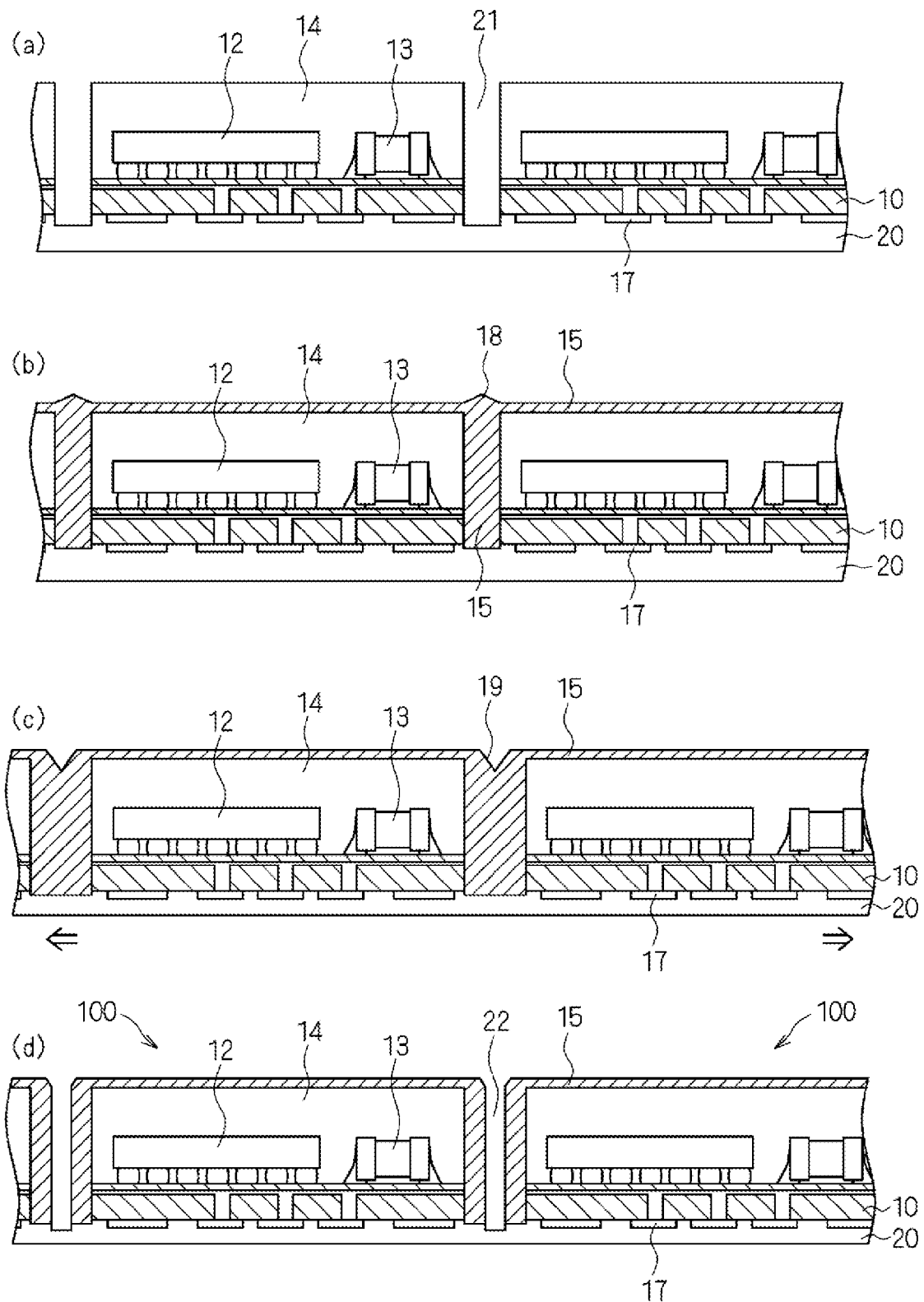
FIGS. 6(a) to 6(d) are schematic diagrams for describing a method of manufacturing electronic component modules according to a second exemplary embodiment.

FIG. 6 is a schematic diagram for describing a method of manufacturing electronic component modules 100 according to the second exemplary embodiment. First, as illustrated in FIG. 6(*a*), a surface of an aggregate substrate 10 on which a plurality of electronic components 12 and 13 are mounted is sealed with a sealing resin 14. An adhesive sheet 20 is attached to a bottom surface of the aggregate substrate 10 on which external terminal electrodes 17 are provided. Boundary portions between electronic component modules 100 are cut using a dicer or the like from a top surface of the sealing resin 14 to positions where the aggregate substrate 10 is completely cut, so that first grooves 21 are formed. The aggregate substrate 10 is fully cut and divided into the individual electronic component modules 100. However, since the adhesive sheet 20 is attached to the bottom surface of the aggregate substrate 10, the individual electronic component modules 100 are in a state of being brought together even though the first grooves 21 that allow the aggregate substrate 10 to be completely cut are formed. In the case where the aggregate substrate 10 is completely cut, the bottom surface of each of the first grooves 21 is the adhesive sheet 20.

Next, as illustrated in FIG. 6(*b*), a shield layer 15 is formed by coating the top surface of the sealing resin 14 with a conductive resin and filling the first grooves 21 with the conductive resin. As a method of forming the shield layer 15, for example, a printing method, a vacuum printing method, or the like is used. In the case where the conductive resin is supplied to the top surface of the sealing resin 14 and to the first grooves 21 using a mesh mask (not illustrated) by a printing method, a vacuum printing method, or the like, the mesh mask pulls on the conductive resin that has been supplied when the aggregate substrate 10 is separated from the mesh mask, and conductive-resin projections 18 are formed on the shield layer 15.

Next, as illustrated in FIG. 6(*c*), the adhesive sheet 20 is stretched in the directions of the arrows using an expanding apparatus or the like (not illustrated), and the width of each of the first grooves 21 is increased while the conductive resin with which the first grooves 21 are filled is in an uncured state, so that the shield layer 15 dips, and recesses 19 are formed at positions on the shield layer 15 where the first grooves 21 are formed. Since the recesses 19 are formed at positions where the conductive-resin projections 18 are formed, even if the conductive-resin projections 18 are formed, the conductive-resin projections 18 do not affect the heights of the electronic component modules 100, and a reduction in the height of each of the electronic component modules 100 can be realized. In addition, the aggregate substrate 10 is placed in, for example, a heating furnace, a vacuum furnace, or the like while the adhesive sheet 20 is maintained in a stretched state, and the conductive resin is cured, so that the shape of each of the recesses 19 that have been formed in the shield layer 15 can be maintained even if the aggregate substrate 10 is released from the expanding apparatus or the like.

Next, as illustrated in FIG. 6(*d*), the boundary portions between the electronic component modules 100 are cut along the corresponding recesses 19 from the side of the top surface of the sealing resin 14 to the positions where the aggregate substrate 10 is completely cut, second grooves 22 each having a width smaller than the width of a corresponding one of the recesses 19 are formed, and the aggregate substrate 10 is singulated into the individual electronic component modules 100. As with the method of manufacturing the electronic component modules 100 according to the first embodiment, when one of the boundary portions between the electronic component modules 100 is cut along the corresponding recess 19 using a dicer or the like from the side of the top surface of the sealing resin 14 in order to form one of the second grooves 22, the dicer or the like and the shield layer 15 are brought into contact with each other not on the surface of the shield layer 15 but on an inner surface of the recess 19. Thus, conductive-resin burrs caused by cutting the conductive resin using the dicer or the like are formed in the recess 19. Therefore, as illustrated in FIG. 5(*b*), even if the conductive-resin burrs 50 are formed, the influence of each of the conductive-resin burrs 50 on the height H of the electronic component module 100 is small, and a reduction in the height of the electronic component module 100 can be realized.

Note that since the adhesive sheet 20 is attached to the bottom surface of the aggregate substrate 10 illustrated in FIG. 6(*d*), the individual electronic component modules 100 are in a state of being brought together even if the second grooves 22 are formed by completely cutting the aggregate substrate 10. Thus, in order to singulate the aggregate substrate 10 into the individual electronic component modules 100, the individual electronic component modules 100 need to be separated from the adhesive sheet 20.

As described above, in the method of manufacturing the electronic component modules 100 according to the second embodiment, the width of each of the first grooves 21 is increased while the conductive resin with which the first grooves 21 are filled is in an uncured state, so that the shield layer 15 dips. Thus, it is not necessary to use an apparatus that scrapes off the conductive resin, and the recesses 19 can be formed at the positions on the shield layer 15 where the first grooves 21 are formed.

In the method of manufacturing the electronic component modules 100 according to the first embodiment, while the conductive resin with which the first grooves 21 are filled is in an uncured state, the aggregate substrate 10 on which the sealing resin 14 is formed is made to curve in such a manner that the top surface of the sealing resin 14 becomes a convex surface, and the width of each of the first grooves 21 is increased, so that the shield layer 15 dips, and the recesses 19 are formed at the positions on the shield layer 15 where the first grooves 21 are formed. However, in a method of manufacturing electronic component modules according to a third exemplary embodiment, a conductive resin with which first grooves are filled is cured, parts of the conductive resin that has been cured are scraped off, and recesses are formed at positions on a shield layer where the first grooves are formed. Note that an electronic component module according to the third embodiment has a configuration the same as that of the electronic component module 100 illustrated in FIG. 1, and thus, similar or the same reference numerals are used, and detailed descriptions thereof will not be repeated.

Figure 7:
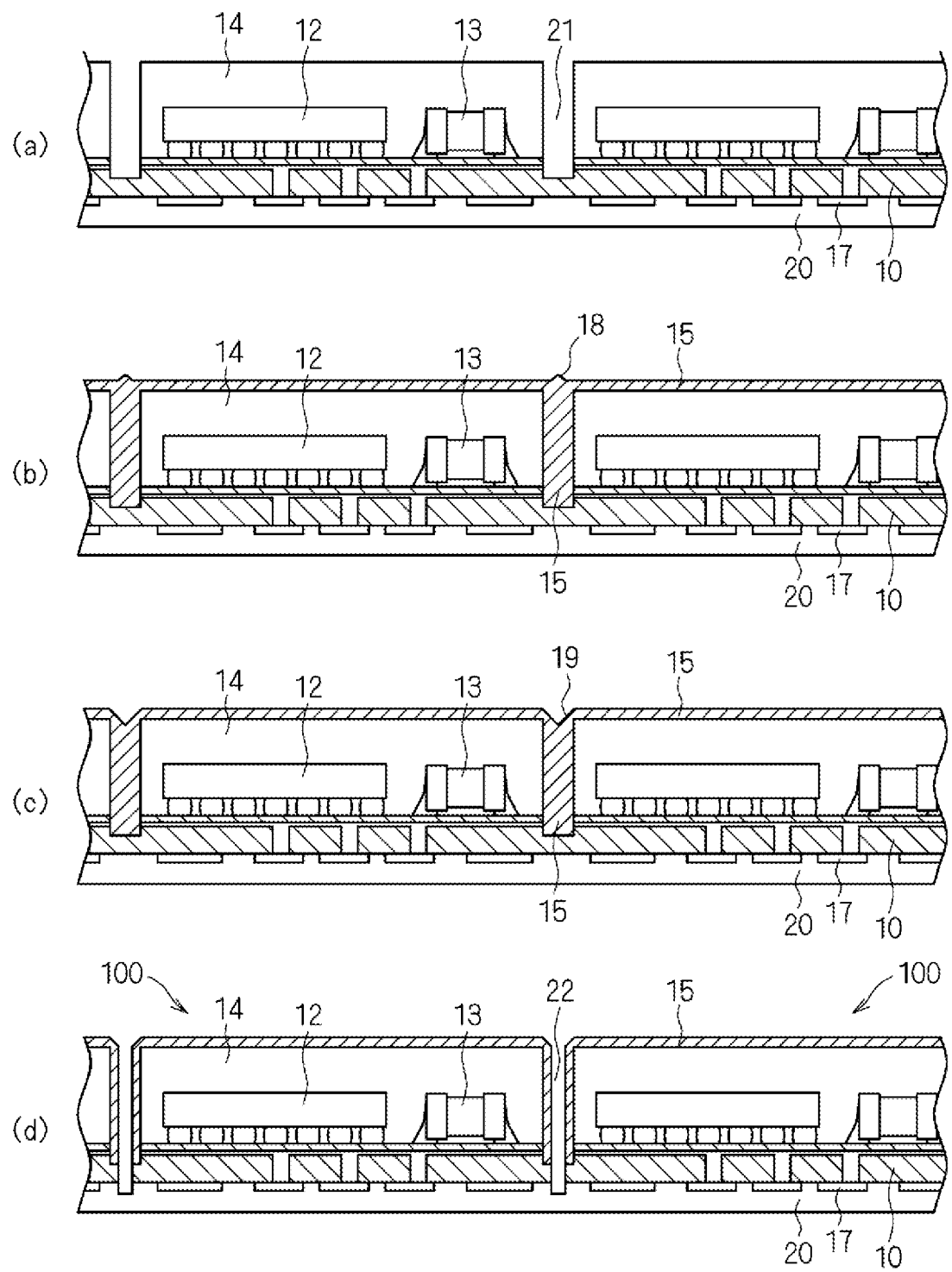
FIGS. 7(a) to 7(d) are schematic diagrams for describing a method of manufacturing electronic component modules according to a third exemplary embodiment.

FIGS. 7(a) to 7(d) are schematic diagrams for describing a method of manufacturing electronic component modules 100 according to the third exemplary embodiment. First, as illustrated in FIG. 7(a), a surface of an aggregate substrate 10 on which a plurality of electronic components 12 and 13 are mounted is sealed with a sealing resin 14. An adhesive sheet 20 is attached to a bottom surface of the aggregate substrate 10 on which external terminal electrodes 17 are provided. Boundary portions between electronic component modules 100 are cut using a dicer or the like from a top surface of the sealing resin 14 to positions where the aggregate substrate 10 is cut halfway through, so that first grooves 21 are formed. In the case where the aggregate substrate 10 is cut halfway through, the bottom surface of each of the first grooves 21 is the aggregate substrate 10. Note that embodiments consistent with the present disclosure are not limited to the case where the aggregate substrate 10 is cut halfway through, and the first grooves 21 may be formed by completely cutting the aggregate substrate 10. In the case the aggregate substrate 10 is completely cut, the bottom surface of each of the first grooves 21 is the adhesive sheet 20.

Next, as illustrated in FIG. 7(b), a shield layer 15 is formed by coating the top surface of the sealing resin 14 with a conductive resin and filling the first grooves 21 with the conductive resin. As a method of forming the shield layer 15, for example, a printing method, a vacuum printing method, or the like is used. In the case where the conductive resin is supplied to the top surface of the sealing resin 14 and to the first grooves 21 using a mesh mask (not illustrated) by a printing method, a vacuum printing method, or the like, the mesh mask pulls on the conductive resin that has been supplied when the aggregate substrate 10 is separated from the mesh mask, and conductive-resin projections 18 are formed on the shield layer 15.

Next, as illustrated in FIG. 7(c), the conductive resin with which the first grooves 21 are filled is cured, and parts of the conductive resin that has been cured are cut using the dicer or the like in such a manner as to have a V-shaped cross section in a vertical direction in FIG. 7(c) (a bevel cutting), so that recesses 19 are formed at positions on the shield layer 15 where the first grooves 21 are formed. Since the recesses 19 are formed at positions where the conductive-resin projections 18 are formed, the conductive-resin projections 18 are scraped off. Therefore, even if the conductive-resin projections 18 are formed, the conductive-resin projections 18 do not affect the heights of the electronic component modules 100, and a reduction in the height of each of the electronic component modules 100 can be realized.

Next, as illustrated in FIG. 7(d), the boundary portions between the electronic component modules 100 are cut along the corresponding recesses 19 from the side of the top surface of the sealing resin 14 to the positions where the aggregate substrate 10 is completely cut, so that second grooves 22 each having a width smaller than the width of a corresponding one of the recesses 19 are formed, and the aggregate substrate 10 is singulated into the individual electronic component modules 100. As with the method of manufacturing the electronic component modules 100 according to the first embodiment, when one of the boundary portions between the electronic component modules 100 is cut using the dicer or the like along the corresponding recess 19 from the side of the top surface of the sealing resin 14 to the position where the aggregate substrate 10 is completely cut in order to form one of the second grooves 22, the dicer or the like and the shield layer 15 are brought into contact with each other not on the surface of the shield layer 15 but on an inner surface of the recess 19. Thus, conductive-resin burrs caused by cutting the conductive resin using the dicer or the like are formed in the recess 19. Therefore, as illustrated in FIG. 5(b), in the electronic component module 100, even if the conductive-resin burrs 50 are formed, the influence of each of the conductive-resin burrs 50 on the height H of the electronic component module 100 is small, and a reduction in the height of the electronic component module 100 can be realized.

Note that since the adhesive sheet 20 is attached to the bottom surface of the aggregate substrate 10 illustrated in FIG. 7(d), the individual electronic component modules 100 are in a state of being brought together even if the second grooves 22 are formed by completely cutting the aggregate substrate 10. Thus, in order to singulate the aggregate substrate 10 into the individual electronic component modules 100, the individual electronic component modules 100 need to be separated from the adhesive sheet 20.

As described above, in the method of manufacturing the electronic component modules 100 according to the third exemplary embodiment, the conductive resin with which the first grooves 21 are filled is cured, parts of the conductive resin that has been cured are scraped off, and the recesses 19 are formed at the positions on the shield layer 15 where the first grooves 21 are formed. Therefore, the recesses 19 each having a desired size can be uniformly formed.

In the methods of manufacturing the electronic component modules 100 according to the first to third exemplary embodiments, the recesses 19 are formed at the positions on the shield layer 15 where the first grooves 21 are formed after the shield layer 15 has been formed. However, in a method of manufacturing electronic component modules according to a fourth exemplary embodiment, recesses are formed at positions on a shield layer where first grooves are formed by adjusting the quantity of a conductive resin with which the first grooves are filled in such a manner that portions of the shield layer at positions where the first grooves are formed dip. Note that an electronic component module according to the fourth embodiment has a configuration the same as that of the electronic component module 100 illustrated in FIG. 1, and thus, similar or the same reference numerals are used, and detailed descriptions thereof will not be repeated.

Figure 8:
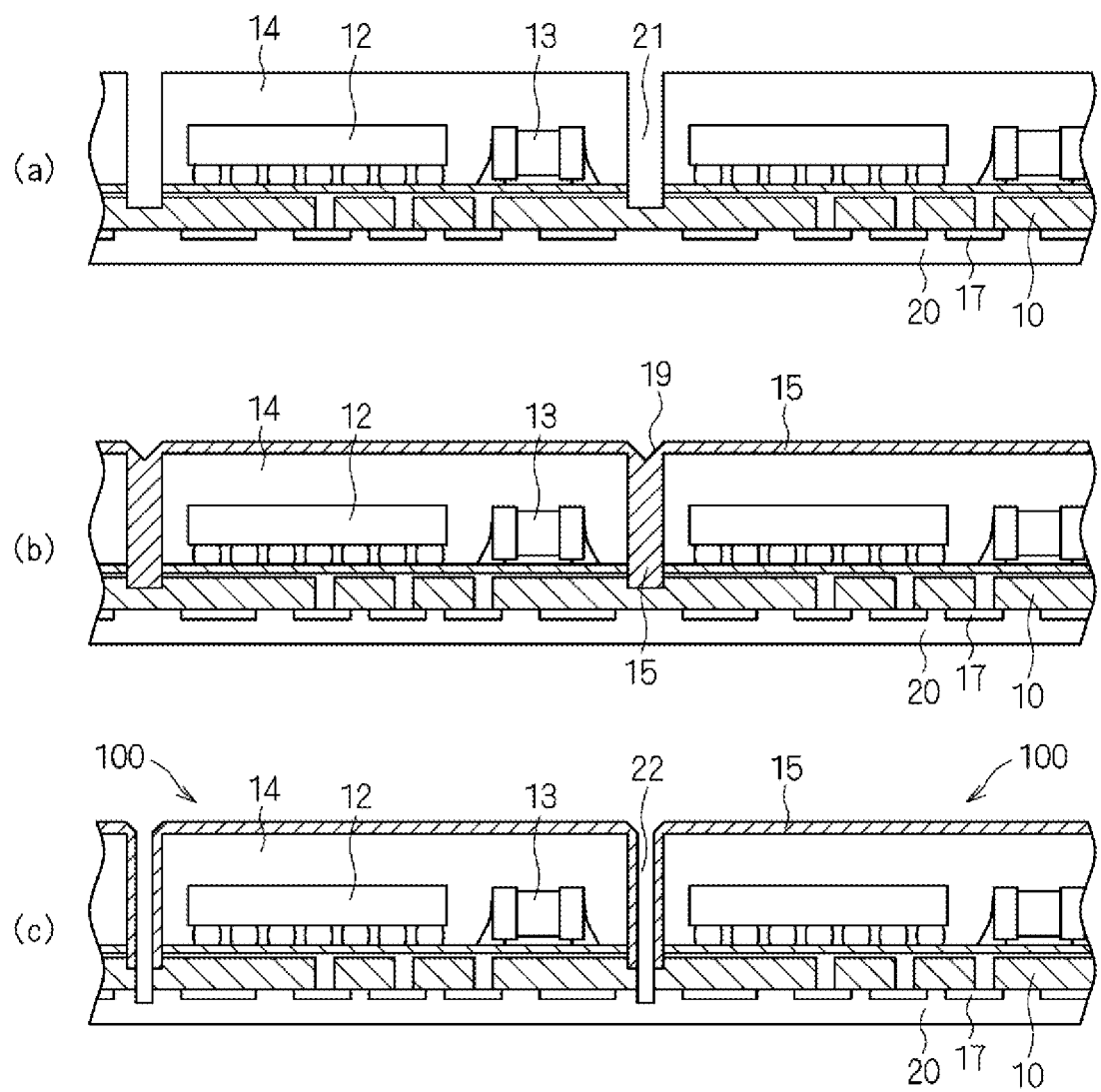
FIGS. 8(a) to 8(c) are schematic diagrams for describing a method of manufacturing electronic component modules according to a fourth exemplary embodiment.

FIGS. 8(a) to 8(c) are schematic diagrams for describing a method of manufacturing electronic component modules 100 according to the fourth exemplary embodiment. First, as illustrated in FIG. 8(a), a surface of an aggregate substrate 10 on which a plurality of electronic components 12 and 13 are mounted is sealed with a sealing resin 14. An adhesive sheet 20 is attached to a bottom surface of the aggregate substrate 10 on which external terminal electrodes 17 are provided. Boundary portions between electronic component modules 100 are cut using a dicer or the like from a top surface of the sealing resin 14 to positions where the aggregate substrate 10 is cut halfway through, so that first grooves 21 are formed. In the case where the aggregate substrate 10 is cut halfway through, the bottom surface of each of the first grooves 21 is the aggregate substrate 10. Note that embodiments consistent with the present disclosure are not limited to the case where the aggregate substrate 10 is cut halfway through, and the first grooves 21 may be formed by completely cutting the aggregate substrate 10. In the case the aggregate substrate 10 is completely cut, the bottom surface of each of the first grooves 21 is the adhesive sheet 20.

Next, as illustrated in FIG. 8(b), a shield layer 15 is formed by coating the top surface of the sealing resin 14 with a conductive resin and filling the first grooves 21 with the conductive resin. As a method of forming the shield layer 15, for example, a printing method, a vacuum printing method, a spin coating method, or the like is used. In the fourth embodiment, when the first grooves 21 are filled with the conductive resin, the quantity of the conductive resin with which the first grooves 21 are filled is adjusted in such a manner that portions of the shield layer 15 at positions where the first grooves 21 are formed dip, so that recesses 19 are formed at the positions on the shield layer 15 where the first grooves 21 are formed.

The quantity of the conductive resin with which the first grooves 21 are filled can be adjusted by various methods. For example, the conductive resin the quantity of which is adjusted in such a manner that the quantity of the conductive resin with which each of the first grooves 21 is filled is slightly smaller than the spatial volume of each of the first grooves 21 is printed through a mesh mask, so that the first grooves 21 can be sufficiently filled with the conductive resin, and in addition, each of the first grooves 21 can be in a state in which a slight dip is formed therein. In this case, it is preferable that printing be performed while areas in the first grooves 21 are degassed by a vacuum printing method. Since the quantity of the conductive resin with which the first grooves 21 are filled is small, the mesh mask becomes less likely to pull on the conductive resin when the aggregate substrate 10 is separated from the mesh mask, and conductive-resin projections are not formed on the shield layer 15.

Alternatively, the first grooves 21 can be sufficiently filled with the conductive resin, and in addition, each of the first grooves 21 can be in a state in which a slight dip is formed therein by previously filling parts of the first grooves 21 with a first conductive resin by a printing method and applying a second conductive resin the quantity of which allows the portions of the shield layer 15 at the positions where the first grooves 21 are formed to dip onto the first conductive resin by a spin coating method. In this case, the first conductive resin and the second conductive resin may be the same resin or may be different resins.

Next, as illustrated in FIG. 8(c), the boundary portions between the electronic component modules 100 are cut along the corresponding recesses 19 from the side of the top surface of the sealing resin 14 to the positions where the aggregate substrate 10 is completely cut, so that second grooves 22 each having a width smaller than the width of a corresponding one of the recesses 19 are formed, and the aggregate substrate 10 is singulated into the individual electronic component modules 100. As with the method of manufacturing the electronic component modules 100 according to the first exemplary embodiment, when one of the boundary portions between the electronic component modules 100 is cut using a dicer or the like along the corresponding recess 19 from the side of the top surface of the sealing resin 14 to the position where the aggregate substrate 10 is completely cut in order to form one of the second grooves 22, the dicer or the like and the shield layer 15 are brought into contact with each other not on the surface of the shield layer 15 but on an inner surface of the recess 19. Thus, conductive-resin burrs caused by cutting the conductive resin using the dicer or the like are formed in the recess 19. Therefore, as illustrated in FIG. 5(b), in the electronic component modules 100, even if the conductive-resin burrs 50 are formed, the influence of each of the conductive-resin burrs 50 on the height H of the electronic component module 100 is small, and a reduction in the height of the electronic component modules 100 can be realized.

Note that since the adhesive sheet 20 is attached to the bottom surface of the aggregate substrate 10 illustrated in FIG. 8(c), the individual electronic component modules 100 are in a state of being brought together even if the second grooves 22 are formed by completely cutting the aggregate substrate 10. Thus, in order to singulate the aggregate substrate 10 into the individual electronic component modules 100, the individual electronic component modules 100 need to be separated from the adhesive sheet 20.

As described above, in the method of manufacturing the electronic component modules 100 according to the fourth exemplary embodiment, the quantity of the conductive resin with which the first grooves 21 are filled is adjusted in such a manner that the portions of the shield layer 15 at the positions where the first grooves 21 are formed dip, so that the recesses 19 are formed at the positions on the shield layer 15 where the first grooves 21 are formed. The boundary portions between the electronic component modules 100 are cut along the corresponding recesses 19 from the side of the top surface of the sealing resin 14 to the positions where the aggregate substrate 10 is completely cut or to positions where the aggregate substrate 10 is cut halfway through, so that the second grooves 22 each having the width smaller than the width of the corresponding recess 19 are formed, and the aggregate substrate 10 is singulated into the individual electronic component modules 100. Therefore, the conductive-resin burrs 50 caused by cutting the conductive resin using the dicer or the like are formed in the recesses 19. Even if the conductive-resin burrs 50 are formed, the influence of each of the conductive-resin burrs 50 on the height of the corresponding electronic component module 100 is small, and a reduction in the height of each of the electronic component modules 100 can be realized. In the case where the shield layer 15 is formed by coating the top surface of the sealing resin 14 with the conductive resin and filling the first grooves 21 with the conductive resin by a printing method, a vacuum printing method, or the like, since the quantity of the conductive resin with which the first grooves 21 are filled is adjusted in such a manner that the portions of the shield layer 15 at the positions where the first grooves 21 are formed dip, the mesh mask can be prevented from pulling on the conductive resin when the aggregate substrate 10 is separated from the mesh mask, and conductive-resin projections 18 can be prevented from being formed at the positions on the shield layer 15 where the first grooves 21 are formed. Therefore, a reduction in the height of each of the electronic component modules 100 can be realized.

In the above-described configuration in which a recess is formed at the position on the shield layer where the first groove is formed, the boundary portion between the electronic component modules is cut along the recess from an outer surface side of the shield layer to the position where the aggregate substrate is cut at least partially through, the second groove having the width smaller than the width of the recess is formed, and the aggregate substrate is singulated into the individual electronic component modules. Thus, a conductive-resin burr caused by cutting the conductive resin using a dicer or the like is formed in the recess. Even if a conductive-resin burr is formed, the influence of the conductive-resin burr on the height of the corresponding electronic component module is small, and a reduction in the height of the electronic component module can be realized. In the case where the shield layer is formed by coating the outer surface of the sealing resin with the conductive resin and filling the first groove with the conductive resin by a printing method, a vacuum printing method, or the like, even if a mesh mask pulls on the conductive resin when the aggregate substrate is separated from the mesh mask, and a conductive-resin projection is formed at the position on the shield layer where the first groove is formed, a recess is formed at the position in a subsequent process. Therefore, even if a conductive-resin projection is formed, the conductive-resin projection does not affect the height of the corresponding electronic component module, and a reduction in the height of the electronic component module can be realized.

In embodiments of the method of manufacturing an electronic component module according to the present disclosure in which the aggregate substrate on which the sealing resin is formed is made to curve in such a manner that the outer surface of the sealing resin becomes a convex surface while the conductive resin with which the first groove is filled is in an uncured state, so that the recess is formed at the position on the shield layer where the first groove is formed, while the conductive resin with which the first groove is filled is in an uncured state, the aggregate substrate on which the sealing resin is formed is made to curve in such a manner that the top surface of the sealing resin becomes a convex surface, and the width of a portion of the first groove adjacent to the top surface of the sealing resin is increased, so that the shield layer dips, and a recess can be formed at the position on the shield layer where the first groove is formed. The aggregate substrate is placed on and fixed onto a surface of a jig that has a predetermined curvature and that protrudes in a convex manner, and the aggregate substrate that is fixed in place is made to curve, so that the width of the portion of the first groove adjacent to the top surface of the sealing resin can be uniformly increased, and a recess that has a small variation in size can be formed at the position on the shield layer where the first groove is formed.

In embodiments of the method of manufacturing an electronic component module according to the present disclosure in which the width of the first groove is increased while the conductive resin with which the first groove is filled is in an uncured state, so that the recess is formed at the position on the shield layer where the first groove is formed, the width of the first groove is increased while the conductive resin with which the first groove is filled is in an uncured state, so that the shield layer dips. Therefore, it is not necessary to use an apparatus that scrapes off the conductive resin, and the recess can be formed at the position on the shield layer where the first groove is formed.

In embodiments of the method of manufacturing an electronic component module according to the present disclosure in which the conductive resin with which the first groove is filled is cured, part of the conductive resin that has been cured is scraped off, and the recess may be formed at the position on the shield layer where the first groove is formed, the conductive resin with which the first groove is filled is cured, and part of the conductive resin that is cured is scraped off, so that the recess is formed at the position on the shield layer where the first groove is formed. Therefore, the recess having a desired size can be uniformly formed.

In the above-described configuration in which the recess is formed at the position on the shield layer where the first groove is formed by adjusting the quantity of the conductive resin with which the first groove is filled in such a manner that the portion of the shield layer at the position where the first groove is formed dips, and the boundary portion between the electronic component modules is cut along the recess from the side of the top surface of the sealing resin to the position where the aggregate substrate is completely cut or to the position where the aggregate substrate is cut halfway through, the second groove having the width smaller than the width of the recess is formed, and the aggregate substrate is singulated into the individual electronic component modules. Thus, the conductive-resin burr caused by cutting the conductive resin using the dicer or the like is formed in the recess. Therefore, even if a conductive-resin burr is formed, the influence of the conductive-resin burr on the height of the corresponding electronic component module is small, and a reduction in the height of the electronic component module can be realized. In the case where the shield layer is formed by coating the top surface of the sealing resin with the conductive resin and filling the first groove with the conductive resin by a printing method, a vacuum printing method, or the like, since the quantity of the conductive resin with which the first groove is filled is adjusted in such a manner that the portion of the shield layer at the position where the first groove is formed dips, the mesh mask can be prevented from pulling on the conductive resin when the aggregate substrate is separated from the mesh mask, and a conductive-resin projection can be prevented from being formed at the position on the shield layer where the first groove is formed. Thus, a reduction in the height of each of the electronic component modules can be realized.

In embodiments of the present disclosure in which an electronic component module is manufactured by the method of manufacturing an electronic component module having any one of the above-described configurations, even if a conductive-resin burr, a conductive-resin projection, or the like is formed on the shield layer, a reduction in the height of the electronic component module can be realized.

In embodiments of an electronic component module that includes a base substrate, a plurality of electronic components that are mounted on at least one surface of the base substrate, a sealing resin that seals the plurality of electronic components mounted on the one surface of the base substrate, and a shield layer that coats an outermost surface of the sealing resin and coats at least parts of side surfaces of the sealing resin, where the shield layer formed on each of the side surfaces of the sealing resin is formed in such a manner that the thickness of a portion of the shield layer adjacent to the outermost surface of the sealing resin is smaller than the thicknesses of other portions of the shield layer, even if the conductive-resin burr, the conductive-resin projection, or the like is formed on the shield layer when the electronic component module is manufactured, a reduction in the height of the electronic component module can be realized.

According to the configuration that has been described above, the recess is formed at the position on the shield layer where the first groove is formed, the boundary portion between electronic component modules is cut along the recess from the side of the top surface of the sealing resin to the position where the aggregate substrate is completely cut or to the position where the aggregate substrate is cut halfway through, the second groove having the width smaller than the width of the recess is formed, and the aggregate substrate is singulated into the individual electronic component modules. Thus, a conductive-resin burr caused by cutting the conductive resin using a dicer or the like is formed in the recess. Therefore, even if a conductive-resin burr is formed, the influence of the conductive-resin burr on the height of the corresponding electronic component module is small, and a reduction in the height of the electronic component module can be realized.

In the case where the shield layer is formed by coating the top surface of the sealing resin with the conductive resin and filling the first groove with the conductive resin by a printing method, a vacuum printing method, or the like, even if the mesh mask pulls on the conductive resin when the aggregate substrate is separated from the mesh mask, and a conductive-resin projection is formed at the position on the shield layer where the first groove is formed, the recess is formed at the position in the subsequent process. Therefore, even if a conductive-resin projection is formed, the conductive-resin projection does not affect the height of the corresponding electronic component module, and a reduction in the height of the electronic component module can be realized.

In another configuration that has been described above, in the third step, the recess is formed at the position on the shield layer where the first groove is formed by adjusting the quantity of the conductive resin with which the first groove is filled in such a manner that the portion of the shield layer at the position where the first groove is formed dips. In the fourth step, the boundary portion between the electronic component modules is cut along the recess from the side of the top surface of the sealing resin to the position where the aggregate substrate is completely cut or to the position where the aggregate substrate is cut halfway through, the second groove having the width smaller than the width of the recess is formed, and the aggregate substrate is singulated into the individual electronic component modules. Thus, a conductive-resin burr caused by cutting the conductive resin using the dicer or the like is formed in the recess. Therefore, even if a conductive-resin burr is formed, the influence of the conductive-resin burr on the height of the corresponding electronic component module is small, and a reduction in the height of the electronic component module can be realized.

In the case where the shield layer is formed by coating the top surface of the sealing resin with the conductive resin and filling the first groove with the conductive resin by a printing method, a vacuum printing method, or the like, since the quantity of the conductive resin with which the first groove is filled is adjusted in such a manner that the portion of the shield layer at the position where the first groove is formed dips, the mesh mask can be prevented from pulling on the conductive resin when the aggregate substrate is separated from the mesh mask, and a conductive-resin projection can be prevented from being formed at the position on the shield layer where the first groove is formed. Thus, a reduction in the height of the electronic component module can be realized.

In still another configuration that has been described above, the shield layer formed on each of the side surfaces of the sealing resin is formed in such a manner that the thickness of the portion of the shield layer adjacent to the top surface of the sealing resin is smaller than the thicknesses of other portions of the shield layer. Therefore, even if a conductive-resin burr, a conductive-resin projection, or the like is formed on the shield layer when the electronic component module is manufactured, a reduction in the height of the electronic component module can be realized.

That which is claimed is:

1. A method of manufacturing an electronic component module, comprising:
   a first step of sealing a surface of an aggregate substrate on which a plurality of electronic components are mounted with a sealing resin;
   a second step of cutting a boundary portion between electronic component modules from an outer surface of the sealing resin to a position where the aggregate substrate is cut at least partially through and forming a first groove;
   a third step of forming a shield layer by coating the outer surface of the sealing resin with a conductive resin and by filling the first groove with the conductive resin;
   a fourth step of forming a conductive resin projection at a position on the shield layer where the first groove is formed and forming a recess at a position where the conductive resin projection is formed; and
   a fifth step of cutting the boundary portion between the electronic component modules along the recess from an outer surface side of the shield layer to the position where the aggregate substrate is cut at least partially through, forming a second groove having a width smaller than the width of the recess, and singulating the aggregate substrate into the individual electronic component modules,
   wherein, in the second step, the boundary portion is cut between electronic component modules from an outer surface of the sealing resin to a position where the aggregate substrate is completely cut through.

2. The method of manufacturing an electronic component module according to claim 1,
   wherein, in the fourth step, the aggregate substrate on which the sealing resin is formed is made to curve in such a manner that the outer surface of the sealing resin becomes a convex surface while the conductive resin with which the first groove is filled is in an uncured state, so that the recess is formed at the position on the shield layer where the first groove is formed.

3. The method of manufacturing an electronic component module according to claim 1,
   wherein, in the fourth step, the width of the first groove is increased while the conductive resin with which the first groove is filled is in an uncured state, so that the recess is formed at the position on the shield layer where the first groove is formed.

4. The method of manufacturing an electronic component module according to claim 1,
   wherein, in the fourth step, the conductive resin with which the first groove is filled is cured, part of the conductive resin that has been cured is scraped off, and the recess is formed at the position on the shield layer where the first groove is formed.

5. A method of manufacturing an electronic component module comprising:
   a first step of sealing a surface of an aggregate substrate on which a plurality of electronic components are mounted with a sealing resin;
   a second step of cutting a boundary portion between electronic component modules from an outer surface of the sealing resin to a position where the aggregate substrate is cut at least partially through and forming a first groove;
   a third step of forming a shield layer by coating the outer surface of the sealing resin with a conductive resin and by filling the first groove with the conductive resin; and
   a fourth step of cutting the boundary portion between the electronic component modules from an outer surface side of the shield layer and singulating the aggregate substrate into the individual electronic component modules,
   wherein, in the third step, the quantity of the conductive resin with which the first groove is filled is adjusted in such a manner that a portion of the shield layer at a position where the first groove is formed dips, so that a recess is formed at the position on the shield layer where the first groove is formed, wherein, in the fourth step, the boundary portion between the electronic component modules is cut along the recess from the outer surface side of the shield resin to the position where the aggregate substrate is cut at least partially through, a second groove having a width smaller than the width of the recess is formed, and the aggregate substrate is singulated into the individual electronic component modules, and wherein, in the second step, the boundary portion is cut between electronic component modules from an outer surface of the sealing resin to a position where the aggregate substrate is completely cut through.

6. A method of manufacturing an electronic component module, comprising:

a first step of sealing a surface of an aggregate substrate on which a plurality of electronic components are mounted with a sealing resin;

a second step of cutting a boundary portion between electronic component modules from an outer surface of the sealing resin to a position where the aggregate substrate is cut at least partially through and forming a first groove;

a third step of forming a shield layer by coating the outer surface of the sealing resin with a conductive resin and by filling the first groove with the conductive resin;

a fourth step of forming a recess at a position on the shield layer where the first groove is formed; and a fifth step of cutting the boundary portion between the electronic component modules along the recess from an outer surface side of the shield layer to the position where the aggregate substrate is cut at least partially through, forming a second groove having a width smaller than the width of the recess, and singulating the aggregate substrate into the individual electronic component modules, wherein, in the second step, the boundary portion is cut between electronic component modules from an outer surface of the sealing resin to a position where the aggregate substrate is completely cut through.

7. The method of manufacturing an electronic component module according to claim 6, wherein, in the fourth step, the aggregate substrate on which the sealing resin is formed is made to curve in such a manner that the outer surface of the sealing resin becomes a convex surface while the conductive resin with which the first groove is filled is in an uncured state, so that the recess is formed at the position on the shield layer where the first groove is formed.

8. The method of manufacturing an electronic component module according to claim 6, wherein, in the fourth step, the width of the first groove is increased while the conductive resin with which the first groove is filled is in an uncured state, so that the recess is formed at the position on the shield layer where the first groove is formed.

9. The method of manufacturing an electronic component module according to claim 6, wherein, in the fourth step, the conductive resin with which the first groove is filled is cured, part of the conductive resin that has been cured is scraped off, and the recess is formed at the position on the shield layer where the first groove is formed.

* * * * *